(12) United States Patent
Heringa et al.

(10) Patent No.: US 7,786,506 B2
(45) Date of Patent: Aug. 31, 2010

(54) SEMICONDUCTOR DEVICES WITH A FIELD SHAPING REGION

(75) Inventors: Anco Heringa, Waalre (NL); Raymond J. E. Hueting, Helmond (NL); Jan W. Slotboom, Eersel (NL)

(73) Assignee: NXP B.V., Eindhoven (NL)

( * ) Notice: Subject to any disclaimer, the term of this patent is extended or adjusted under 35 U.S.C. 154(b) by 232 days.

(21) Appl. No.: 12/177,258

(22) Filed: Jul. 22, 2008

(65) Prior Publication Data

US 2010/0038676 A1 Feb. 18, 2010

Related U.S. Application Data

(63) Continuation of application No. 10/556,802, filed as application No. PCT/IB2004/001527 on May 6, 2004, now Pat. No. 7,423,299.

(30) Foreign Application Priority Data

May 13, 2003 (GB) .................................. 0310928.7
Oct. 15, 2003 (GB) .................................. 0324096.7

(51) Int. Cl.
*H01L 29/74* (2006.01)
(52) U.S. Cl. ..................... 257/168; 257/409; 257/107; 438/133; 438/197
(58) Field of Classification Search ................. 257/168, 257/409, 107; 438/133, 197
See application file for complete search history.

*Primary Examiner*—Bradley K Smith
*Assistant Examiner*—Jami M Valentine

(57) ABSTRACT

A semiconductor device includes a semiconductor region having a pn junction and a field shaping region located adjacent the pn junction to increase the reverse breakdown voltage of the device. The field shaping region is coupled via capacitive voltage coupling regions to substantially the same voltages as are applied to the pn junction. When a reverse voltage is applied across the pn junction and the device is non-conducting, a capacitive electric field is present in a part of the field shaping region which extends beyond a limit of the pn junction depletion region which would exist in the absence of the field shaping region. The electric field in the field shaping region inducing a stretched electric field limited to a correspondingly stretched pn junction depletion region in the semiconductor region.

16 Claims, 9 Drawing Sheets

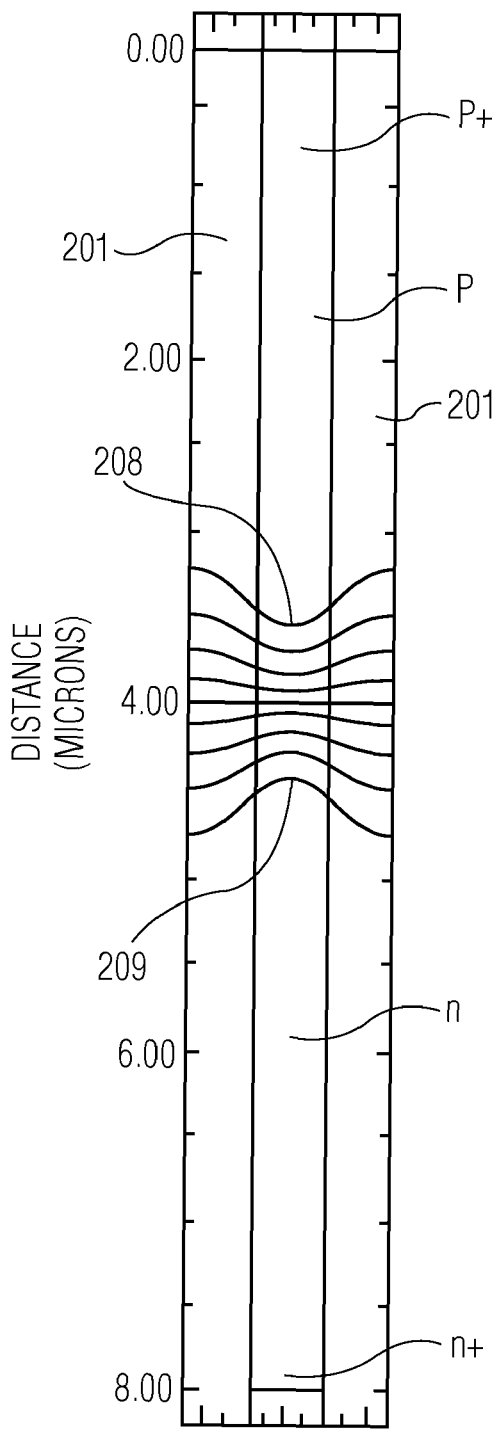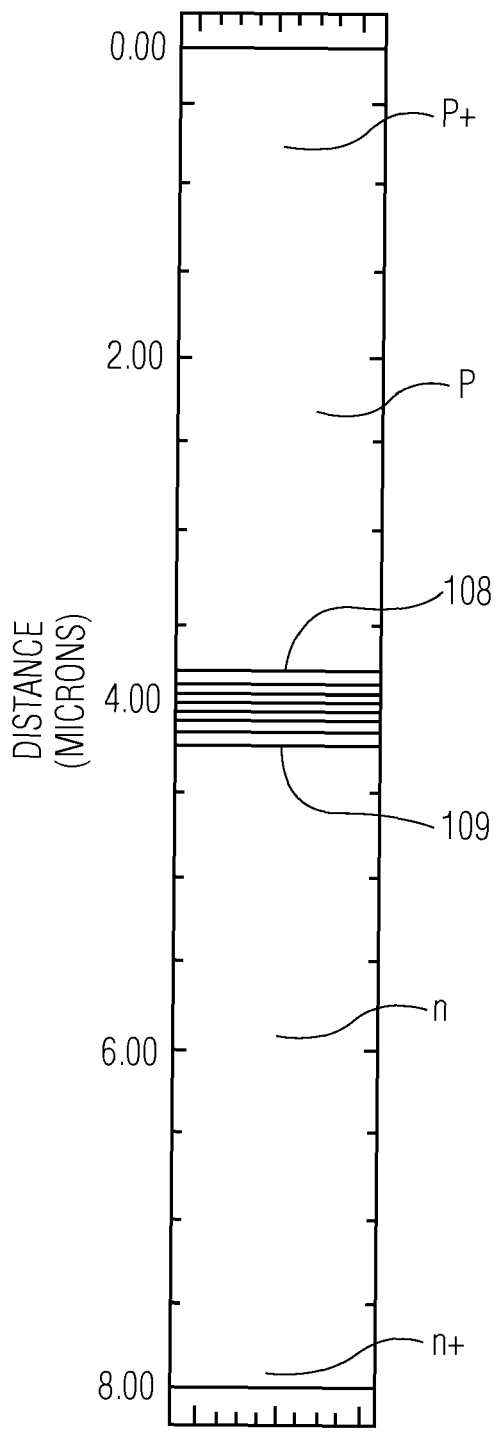
FIG. 3A
FIG. 3B
PRIOR ART

SEMICONDUCTOR DEVICES WITH A FIELD SHAPING REGION

RELATED PATENT DOCUMENTS

This patent document is a continuation under 35 U.S.C. §120 of U.S. patent application Ser. No. 10/556,802 filed on Dec. 21 2006 now U.S. Pat. No. 7,423,299, which is a 35 U.S.C. §371 national stage entry of International Application No. PCT/IB2004/01527 filed on May 6, 2004, which claims priority benefit under 35 U.S.C. §119 of Great Britain Patent Application No. 0310928.7 filed on May 13, 2003 and of Great Britain Patent Application No. 0324096.7 filed on Oct. 15, 2003, to which priority is also claimed here.

BACKGROUND OF THE INVENTION

This invention relates to a semiconductor device including a semiconductor region having a pn junction and a field shaping region located adjacent the pn junction to increase the reverse breakdown voltage of the device.

FIG. 1A of the accompanying drawings shows the structure of a known simple semiconductor pn junction diode device 100. A rectifying junction 101 is formed between a p type region 102 and an n type region 103, regions 102 and 103 being connected to device metal electrodes 104 and 105 respectively via same conductivity more highly doped p+ and n+ regions 106, 107. The reverse breakdown voltage of the diode is strongly related to the allowed maximum electric field (about 0.2 MV/cm for semiconductor silicon). The breakdown voltage depends therefore on the concentration of the equilines of voltage within the edges 108, 109 of the depletion region to either side of the pn junction 101, and thus the extent of the depletion region, which depends on the doping levels at both sides of the pn junction.

The direct relation between doping level and breakdown voltage as occurring in the simple diode shown in FIG. 1A can be circumvented by a variety of known structures all using what is well known as the RESURF mechanism.

One example of a document disclosing RESURF mechanism structures is U.S. Pat. No. 4,754,310 (our reference PHB32740), the contents of which are hereby incorporated by reference. In this US patent examples are disclosed of power devices including rectifier diodes, field effect transistors and bipolar transistors. In the case of a simple rectifier diode there is a structure which is equivalent to that shown schematically in FIG. 1B of the accompanying drawings. In the diode 100B structure shown in FIG. 1B, which has alternating p type and n type zones, the electric field and the edges 108B, 109B of the depletion region are stretched over a larger distance to either side of the pn junction at the same reverse voltage. This leads to higher breakdown voltages. In the case of a field effect transistor a trade off relationship between the on-resistance and the breakdown voltage of the field effect transistor is addressed by providing the drain drift region as a zone formed of first regions of one conductivity type interposed with second regions of the opposite conductivity type, in similar manner to the alternating p type and n type zones shown for a diode in FIG. 1B of the accompanying drawings. The major problem with these arrangements is that there has to be a very good balance of P and N doping in the alternating p type and n type ozones.

International patent application published as WO-A-01159847, the contents of which are hereby incorporated herein by reference (our reference PHNL 000066) provides another way of improving the trade off between breakdown voltage and on resistance in the case of vertical high voltage insulated gate field effect devices. Field shaping regions extend through the drain drift region from the body regions of the device to the drain region. These field shaping regions are semi-insulative or resistive regions which provide current leakage paths from the source regions when the device is non-conducting and a voltage is applied between the main electrodes of the device so as to cause an extension of a depletion region in the drain drift region towards the drain region to increase the reverse breakdown voltage of the device. The small leakage current along the resistive paths causes a linear electrical potential drop along these paths. Hence a substantially constant vertical electric field is generated along these paths and accordingly in the adjacent drain drift region, and this results in the breakdown voltage being greater than for a non-uniform electric field which would occur in the absence of the field shaping region. Thus, as for the invention of U.S. Pat. No. 4,754,310, for a given required breakdown voltage of the device, it is possible to increase the doping concentration of the drain drift region and hence reduce the on-resistance of the device compared with a conventional device.

International patent application published as WO-A-03/015178, the contents of which are hereby incorporated herein by reference, (our reference PHNL010570) discloses a bipolar transistor structure, comprising: a collector including a higher doped collector region of semiconductor material of a first conductivity type doped to a first concentration; an emitter region of semiconductor material of the first conductivity type; a base region of semiconductor material of a second conductivity type opposite to the first conductivity type between the emitter region and the collector; the collector further including a lower doped drift region extending between the higher doped collector region and the base region, the drift region being of the first conductivity type and doped to a second concentration lower than the first concentration; a trench extending adjacent to the drift region; and a gate within the trench insulated from the drift region for controlling the drift region to be depleted of carriers in a voltage blocking mode of operation. The drift region in the collector is of lower doping concentration than the higher doped region of the collector so that the drift region may be depleted of carriers. Using the gate in the trench the drift region can be depleted even with a higher doping in the drift region than would otherwise be possible. This allows the product of the cut off frequency and the breakdown voltage to be increased as compared with prior art structures. Conveniently, the structure may be a vertical structure formed on a semiconductor body having opposed first and second faces. The emitter region may be connected to the first face and the collector region to the second face. The trench may extend substantially perpendicularly to the first face through the emitter and base regions to the drift region. In alternative embodiments, a lateral structure may be provided, for example using an insulated buried layer as the gate. The gate may be of a semi-insulating material, and the structure may further comprise a first gate connection at the end of the gate adjacent to the boundary between the drift region and the base region and a second gate connection at the boundary between the drift region and the higher doped collector region. This allows a uniform field to be applied along the gate thereby providing a uniform field in the drift region to minimise the risk of breakdown at low voltages. The uniform field is achieved without complex doping profiles in the drift region being necessary.

International Patent Application published as WO-A-03/043089, the contents of which are hereby incorporated by reference, (our reference PHNL020937) concerns an invention in which there is provided a field effect transistor semiconductor device comprising a source region, a drain region and a drain drift region, the device having a field shaping region adjacent the drift region and arranged such that, in use, when a reverse voltage is applied between the source and drain regions and the device is non-conducting, a substantially constant electric field is generated in the field shaping region and accordingly in the adjacent drift region, characterised in that the field shaping region is arranged to function as a capacitor dielectric region between a first capacitor electrode region and a second capacitor electrode region, the first and second capacitor electrode regions being adjacent respective ends of the dielectric region and having different electron energy barriers.

By substantially constant electric field it is meant therein that the maximum electric field in the field shaping region and hence in the adjacent drift region at a given voltage is reduced in comparison with the absence of the field shaping region with the consequence that the breakdown voltage of the device is comparatively greater.

In a device according to WO-A-03/043089, it is the different electron energy barriers of the first and second capacitor electrode regions which ensure that in use, when a voltage is applied between the source and drain regions and the device is non-conducting, the field shaping region functions as a capacitor dielectric region rather than a resistive region, there is substantially no space charge in the field shaping region, and within the drift region there is a charge balance between the space charge in the first capacitor electrode region, together with the drain drift region, and the second capacitor electrode region. That is to say, the charge in the drain drift region plus the charge in the first capacitor electrode region compensates the charge of the second capacitor electrode region. It is an applied voltage which capacitively generates the substantially constant electric field in the field shaping region in that invention rather than the leakage current applied through the field shaping region which is provided in the arrangement disclosed in WO-A-01/59847. Also, the problem with the arrangement of U.S. Pat. No. 4,754,310 of providing a precise charge balance between the two opposite conductivity type regions along the length of the drift region does not arise in the arrangement of WO-A-03/043089.

In WO-A-03/043089 the field shaping region is described as being intrinsic semiconductor material, or being extrinsic semiconductor material which is lower doped than the drift region, or being semi-insulating material, for example comprising one of oxygen doped polycrystalline silicon and nitrogen doped polycrystalline silicon. The first capacitor electrode region may be a semiconductor region of one conductivity type with the second capacitor electrode region being a semiconductor region of opposite conductivity type to the first capacitor electrode region. In this case the different electron energy barriers of the first and second capacitor electrode regions are provided by the different work functions of the two semiconductor conductivity types. Alternatively, the first capacitor electrode region may be a semiconductor region with the second capacitor electrode region being a Schottky barrier region. In this case the work function of the first capacitor electrode semiconductor region is an electron energy barrier which is different from the Schottky electron energy barrier of the second capacitor electrode Schottky barrier region. In both cases as just specified, the first capacitor electrode region semiconductor region is of the same conductivity type as the drain region. The transistor may be an insulated gate field effect transistor. This may be a vertical transistor which may be a trench-gate transistor.

SUMMARY OF THE INVENTION

According to the present invention, there is provided a semiconductor device including a semiconductor region having a pn junction and a field shaping region located adjacent the pn junction to increase the reverse breakdown voltage of the device, wherein the field shaping region is insulating material and is coupled to first and second capacitive voltage coupling regions arranged to provide, in use, substantially the same voltages as are applied to the pn junction, the material and capacitive coupling of the field shaping region being such that, when a reverse voltage is applied across the pn junction and the device is non-conducting, a capacitive electric field is present in a part of the field shaping region which extends beyond a limit of the pn junction depletion region which would exist in the absence of the field shaping region, the electric field in the field shaping region inducing a stretched electric field limited to a correspondingly stretched pn junction depletion region in the semiconductor region.

The meaning of "capacitive voltage coupling regions arranged to provide, in use the same voltages as are applied to the pn junction" in the above definition of the present invention will be apparent from the description and explanation of the illustrated examples which follows. However, by way of brief explanation, it is noted here that the field shaping region may simply be directly coupled only to the same p and n semiconductor regions which form the pn junction; or the field shaping region may be coupled at one side to a p+ region adjacent the p region and/or at the other side to an n+ region adjacent the n region; or the field shaping region may be coupled to both p+ and p regions on one side and/or to both n+ and n regions on the other side; or the field shaping region may be coupled at one or both sides to a conductive region electrode (for example metal or highly doped poly silicon) which may be provided for this purpose or which may be a main or control electrode of the semiconductor device; or the field shaping region may be coupled with a combination of such regions as just mentioned.

In devices according to the present invention the field shaping region adjacent the semiconductor pn junction may bridge the pn junction or it may be adjacent only the p or the n side of this pn junction. The field shaping region may be adjacent only one or both sides of the lateral extent of the pn junction. The field shaping region may be directly adjacent the semiconductor region having the pn junction or there may be an intervening insulating region such as $SiO_2$ as a passivation liner. The p region and the n region can have either a constant or a non-uniform e.g. graded doping; the non-uniform doping being preferable in either region if it is used as an on-state drift region.

In the examples of the present invention to be described below, the increase in device reverse breakdown voltage is achieved in a different manner from that disclosed in U.S. Pat. No. 4,754,310 and in published International Patent Applications WO-A-01/59847, WO-A-03/015178 and WO-A-03/043089 discussed above.

BRIEF DESCRIPTION OF THE DRAWINGS

A more detailed description and explanation of examples of the present invention, will now be given with reference to the accompanying drawings, in which:

FIGS. 3A and 3B are graphs illustrating equilines of voltage at breakdown for diode devices respectively as shown in FIG. 2 and as shown in FIG. 1A;

DETAILED DESCRIPTION OF THE INVENTION

Figure 1A:
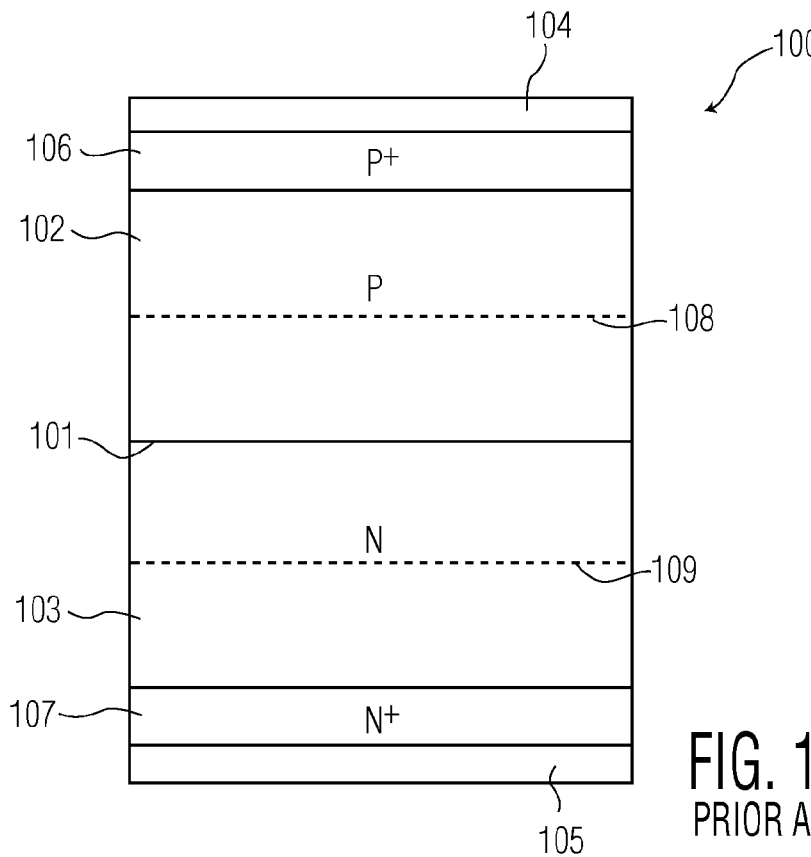
FIGS. 1A and 1B each show a schematic cross-section view of a known semiconductor diode device as has been described above.
Figure 1B:
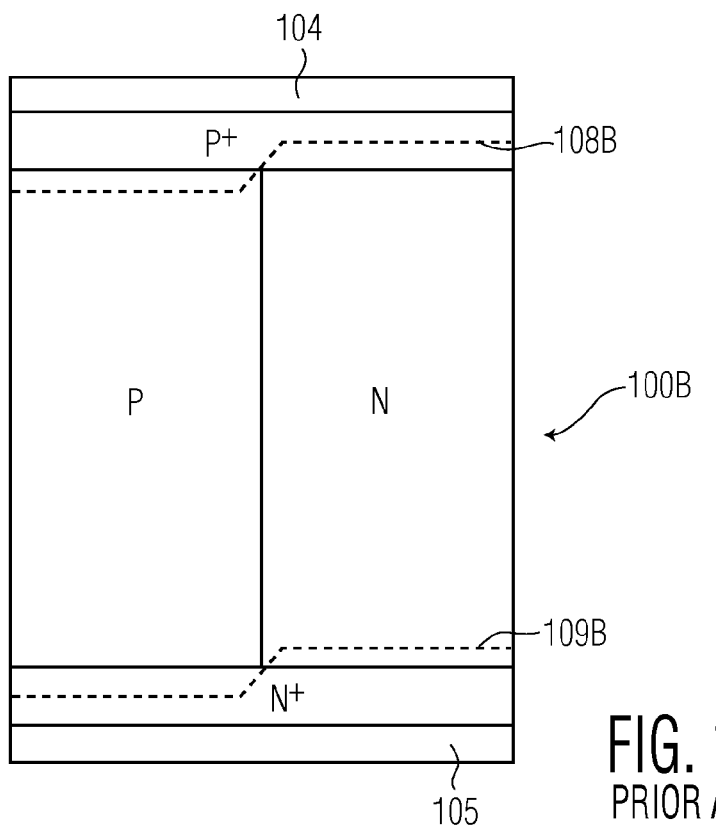
Figure 2:
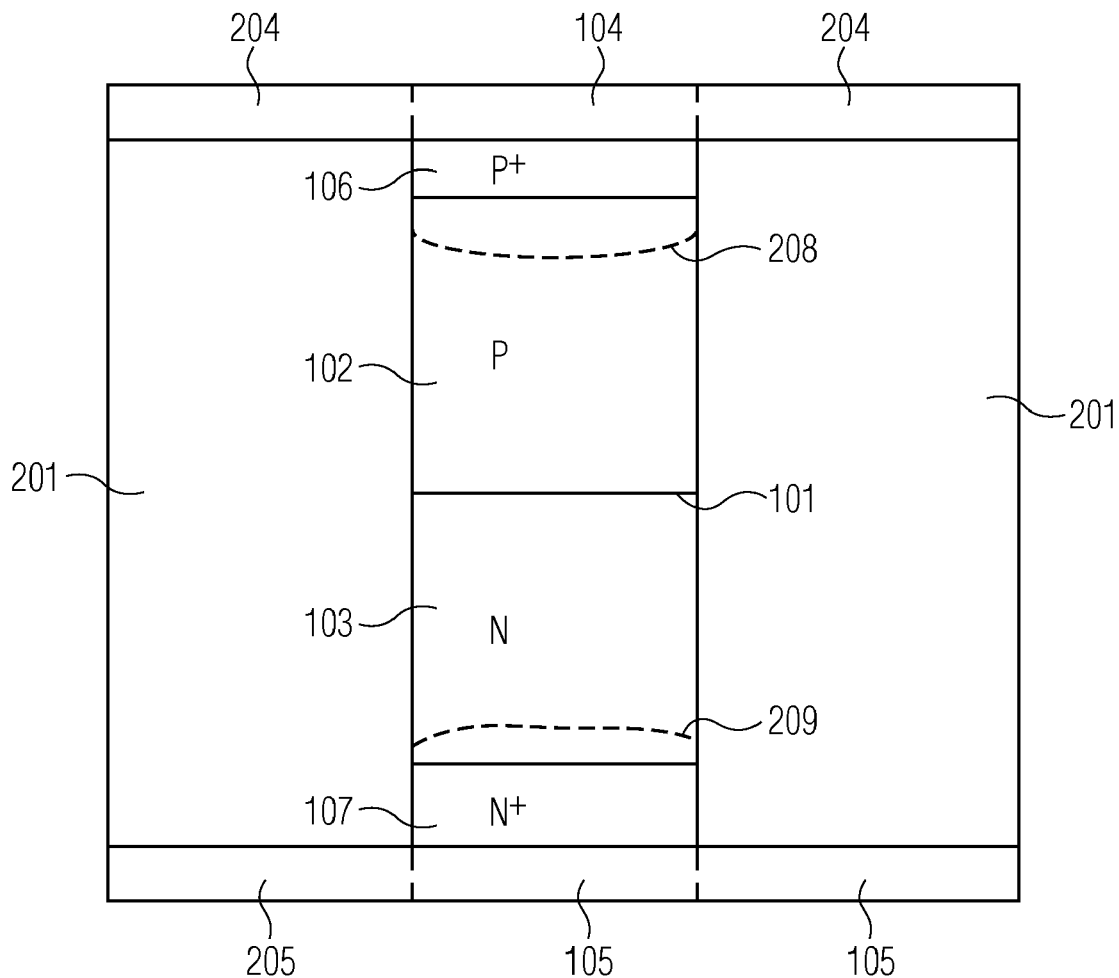
FIG. 2 shows a schematic cross-section view of a semiconductor diode device in accordance with the present invention.

Referring now to FIG. 2 of the accompanying drawings, there is shown a simple semiconductor pn junction diode device 200 in accordance with the present invention. In the same manner as for the known diode device 100 shown in FIG. 1A, the diode device 200 has a rectifying junction 101 formed between a p type region 102 and an n type region 103, regions 102 and 103 being connected to device metal electrodes 104 and 105 respectively via same conductivity more highly doped p+ and n+ regions 106, 107. The diode device 200 also has a field shaping region 201 of insulating dielectric material adjacent both sides of the lateral extent of the pn junction 101 and bridging both the p side 102 and the n side 103 of the pn junction. Each insulating dielectric region 201 is coupled to first and second capacitive voltage coupling regions 204 and 205 which are conductive material, that is to say they are metal and are integral with the main metal electrodes 104 and 105 of the diode device 200. Thus the first and second capacitive voltage coupling regions 204 and 205 are arranged to be in use at substantially the same voltages as are applied via the electrodes 104 and 105 to the pn junction 101. The material and capacitive coupling of each field shaping region 201 are such that, when a reverse voltage is applied across the pn junction 101 and the device 200 is non-conducting, a capacitive electric field is present in a part of each field shaping region 201 which extends beyond a limit of the pn junction depletion region which would exist in the absence of the field shaping region 201, that is as shown by the dashed line edges 108, 109 shown in FIG. 1A. This electric field in the field shaping regions 201 induces a stretched electric field limited to a correspondingly stretched pn junction depletion region in the semiconductor region, and hence an increased reverse breakdown voltage of the device 200. The induced stretched edges of the pn junction depletion region at reverse breakdown voltage are indicated in FIG. 2 by the dashed lines 208, 209. As shown in FIG. 2 each insulating dielectric region 201, in addition to being coupled to the first and second metal capacitor electrode regions 204, 205 is also coupled to the p+, p, n and n+ regions at the sides of the pn junction 101. Instead, at least one of the first and second capacitive voltage coupling regions for each dielectric region 201 could comprise one of the p and n regions 102, 103 which form the pn junction 101, or at least one of the first and second capacitive voltage coupling regions for each dielectric region 201 could comprise a more highly doped semiconductor region of the same conductivity type and adjacent one of the p and n semiconductor regions which form the pn junction, that is the p+ region 106 or the n+ region 107. For example, a dielectric region 201 could be coupled only to the p and n regions 102 and 103, or a dielectric region 201 could be coupled only to the p+ and n+ regions 106 and 107.

The extent of the stretching of the pn junction depletion region and the resulting amount of increase of the diode device reverse breakdown voltage are a function of the doping level of the semiconductor material. The p side and the n side of the pn junction may have the same doping level. Otherwise, the p and n sides may have different doping levels, and if there is a substantial difference then the depletion layer width is mainly determined by the side which is more lowly doped. The extent of increase in the breakdown voltage also depends on the relative widths of the semiconductor material and the field shaping dielectric material. The increase of the breakdown voltage of the semiconductor pn junction relates to the difference of the dielectric constants of the semiconductor material and the insulating field shaping region material. The dielectric constant of, for example, silicon semiconductor material is about 11.7 to 11.9 compared with a dielectric constant of approximately 22 for $Ta_2O_5$ which is a suitable dielectric material for use as the field shaping region(s) in devices according to the present invention. Also, the breakdown electric field strength of the insulating/dielectric material is sufficient to withstand the electric fields occurring in the geometries of the device structures in accordance with the present invention; for example it is 3-5 MV/cm for $Ta_2O_5$. The standard dielectrics silicon dioxide $SiO_2$ and silicon nitride $Si_3N_4$ used in semiconductor devices may also be used for the field shaping region(s) in devices according to the present invention. $SiO_2$ has a dielectric constant of 3.9 and a breakdown strength of 12-15 MV/cm. $Si_3N_4$ has a dielectric constant of 7-9 and a breakdown strength of 10-11 MV/cm which is much higher than the 0.2 MV/cm breakdown field strength for semiconductor silicon.

Referring now to FIGS. 3A and 3B, these are graphs of simulations illustrating equilines of voltage at reverse breakdown voltage for diode devices respectively as shown in FIG. 2 and as shown in FIG. 1A. In FIGS. 3A and 3B the pn junction is at 4.0 micron on the vertical axis, the p+ region is from 0.0 to 0.2, the p region is from 0.2 to 4.0, the n region is from 4.0 to 8.0 and the n+ region is from 8.0 to 8.2. The vertical height of the FIG. 2 device as shown in FIG. 3A was chosen higher than was actually needed; a total height on the vertical axis from 2.5 micron to 5.5 micron would have been sufficient to demonstrate the effect. In the devices of both FIGS. 3A and 3B the doping level of the semiconductor silicon is the same for the p and n regions at 1E17. The breakdown voltage of the FIG. 1A device for which the simulation is shown in FIG. 3B is 21.4 Volt. For the FIG. 2 device shown in FIG. 3A the width of the semiconductor silicon, that is the lateral width of the pn junction, is 0.4 micron and the width of each of the two field shaping insulating dielectric regions 201, which are tantalum oxide, $Ta_2O_5$ is also 0.4 micron. The breakdown voltage of the FIG. 2 device for which the simulation is shown in FIG. 3A is increased from 21.4 Volt to 36 Volt.

The equilines of voltage shown in FIGS. 3A and 3B clearly illustrate the following: (a) the limits of the pn junction depletion region which exist in the absence of a field shaping region (edges 108, 109 shown in FIG. 3B), (b) the capacitive electric field present in a part of each of the field shaping regions 201 (FIG. 3A) which extends beyond the limits 108, 109 (FIG. 3B), and (c) the effect of the capacitive electric field in the field shaping regions 201 inducing a stretched electric field limited to a correspondingly stretched pn junction depletion region (edges 208, 209) in the semiconductor region.

Some explanation of the effect for the device of FIG. 2 as shown in FIG. 3A is as follows. For each field shaping region there is a 2-dimensional capacitor with one plate in the p-region and another in the n-region (more precisely the capacitor plates are distributed: the plates are at a larger distance at larger voltages). The voltage distribution and the field lines around the capacitor plates are a function of the materials (the geometry and their dielectric constants) around the capacitor plates. A simple example is a flat plate capacitor in which an insulating dielectric is inserted between the plates: assuming the same charge at both plates the voltage goes down at the plates. The same type of behaviour holds for the semiconductor diode: introducing the insulating dielectric parallel to the junction and assuming the same charge at both sides will lead to a lower voltage over the diode. Now we can increase the applied voltage up to the point where it was in the beginning. For this action extra charge in the depletion layer, thus a thicker depletion layer is needed. As a consequence a lower field will be at the junction at the same reverse bias. This will result in a higher breakdown voltage.

In a modification of the device shown in FIG. 2, moving the junction upwards (so completely replacing the P by N) leads to a breakdown voltage of 15 Volt if the dielectric regions 201 are not present and 28 Volt with two dielectric regions 201 (again with 0.4 micron wide semiconductor silicon and 0.4 micron wide dielectric regions 201). As a consequence of this modification the capacitive coupling is stronger and thus the depletion region widening will be stronger in the lowly doped n-part. Because the depletion region is wider in the lower doped part and it is possible to extend the depletion region in this lowly doped part more easily also by this capacitive coupling one wants to enhance the effect by a tighter coupling. This is achieved by bringing the voltage from the p+ side closer to the n+ side. Thus the n-region is the piece of material with high resistivity and sustaining the high voltage. So it can also be used in MOSFETs.

Figure 4:
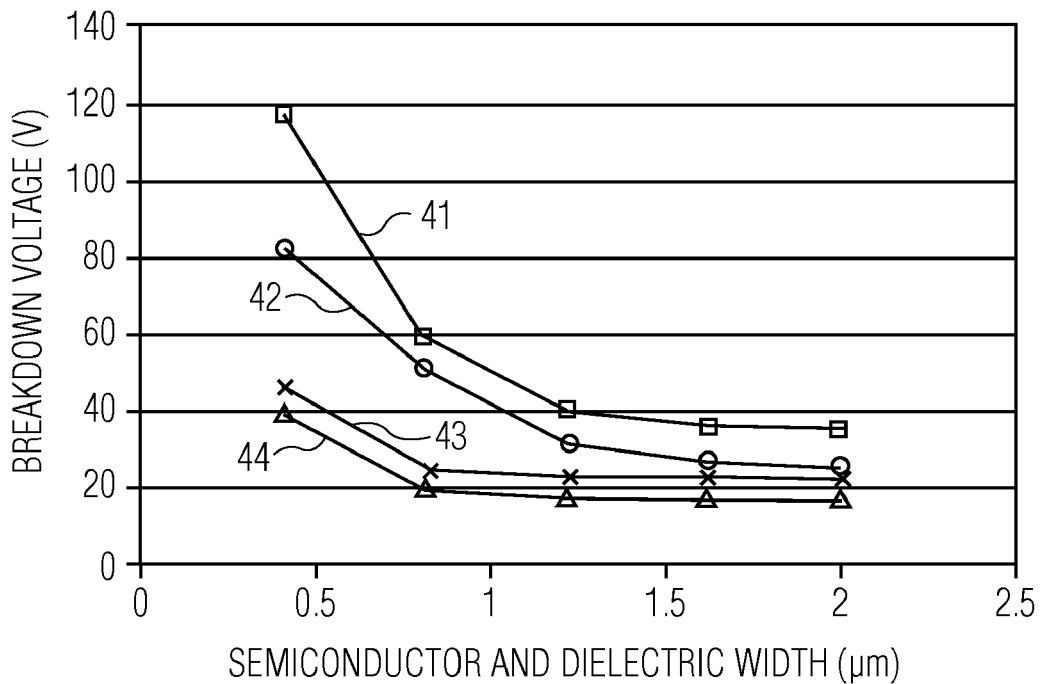
FIG. 4 shows plots of simulated results for the diode of FIG. 2.

FIG. 4 of the accompanying drawings shows a summary of simulated results for the diode of FIG. 2 in which breakdown voltage (volts) is plotted against semiconductor region/dielectric region width (micron). Curves 41 and 42 show the results for a p and n doping of 5E16 respectively for both 2-sided and 1-sided junctions, that is to say with the dielectric adjacent both sides of the pn junction as is shown in FIG. 2 and adjacent only one side of the junction as is also possible within the scope of the present invention. Curves 43 and 44 show the results for a p and n doping of 1E17 similarly for 2-sided and 1-sided junctions.

These results lead to the following implementation proposal:

Etch trenches crossing the diode junctions and fill these with an insulating material, preferably with a high dielectric constant (e.g. Ta2O5 having a dielectric constant >20; a liner of SiO2 for passivation of the silicon (2 nm was used in the results/plots given above). Extra charge (so a wider depletion area) is needed for building up the critical electric field and thus a higher breakdown voltage results. The etching can be done in stripes but it would be even better to etch trenches as either hexagonal or square meshes because then the spreading of voltage is stronger because an even higher charge and thus a wider depletion layer is needed at the same voltage. This mesh, or cellular, arrangement provides a larger area/volume ratio; having a larger area covered by high-k gives a stronger capacitive coupling, thus a stronger widening of the depletion layer (a better "RESURF") and thus a higher breakdown voltage.

Figure 5:
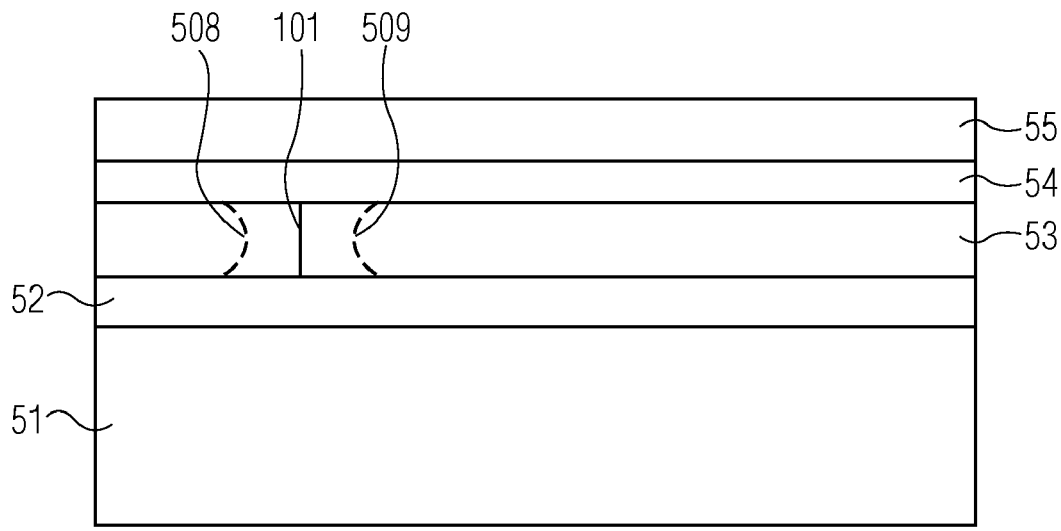
FIG. 5 shows a silicon on insulator structure incorporating field shaping layers in accordance with the present invention.

In accordance with the invention, the concept described above in relation to a semiconductor diode device could be used in any other device with reverse biased junctions such as bipolar junction transistors and MOSFET's for giving a better trade-off between forward voltage drop, that is to say on-resistance, and breakdown voltage. E.g. in MOS devices as high as possible doping in the drain extension is attractive for on-resistance but the required breakdown voltage limits the doping level. By using insulating materials, preferably with a high dielectric constant, for the field shaping region adjacent and possibly bridging the pn junction this limitation is less strict. This adjacent field shaping region could be vertical e.g. in trenches, but also lateral e.g. for edge termination of junctions. Also in SOI (silicon on insulator) devices one could use the mechanism either at the top side or at the bottom side by replacing the oxide layers by field shaping dielectric layers or a sandwich of oxide and field shaping dielectric layers. This configuration with the complete oxide replaced by field shaping dielectric is shown in FIG. 5 of the accompanying drawings, in which layer 51 is a silicon substrate, layer 52 is a buried high k dielectric field shaping region, layer 53 is the SOI semiconductor silicon region having a pn junction 101, layer 54 is a top high k dielectric field shaping region, and layer 55 is a field plate. The induced stretched edges of the pn junction depletion region at reverse breakdown voltage are indicated by the dashed lines 508, 509.

In all devices within the scope of the present invention the higher the dielectric constant of the field shaping insulating material is, the higher the beneficial effect on the breakdown voltage. That is to say, if the field shaping insulating/dielectric material has a higher k value then the stretching of voltage equilines in the electric field in the field shaping material in the region adjacent to the semiconductor pn junction is greater and thus the maximal electric field is lower (the electric field is more relaxed) and the correspondingly induced stretching of the electric field and the pn junction depletion layer in the semiconductor material is greater and hence the breakdown reverse voltage of the pn junction is greater. The greater the k value of the field shaping material the thinner the region of this material can be to achieve a given increase in the breakdown voltage of the semiconductor pn junction. Tantalum oxide Ta2O5 (k value approximately 22) is a preferred material for the field shaping region. Other insulating materials well known in silicon semiconductor technology such as silicon dioxide SiO2 (k approximately 4) and silicon nitride Si3N4 (k approximately 8) could be used for the field shaping region in devices according to the present invention but this region would have to be much thicker than for Ta2O5 in order to achieve the same increase in breakdown voltage of the adjacent pn semiconductor junction. Since the dielectric field shaping region does not conduct any current, a thinner higher k field shaping region/layer leads to higher efficiency because more parallel diode/transistor cells can be present in a given device area with a consequent smaller on-resistance of the device. Other dielectric materials which could be used for the field shaping region in devices according to the present invention and which have a k value greater than that for silicon nitride are for example aluminium oxide Al2O3 (k=4.5-8.4), strontium titanate SiTiO3 and barium titanate BaTiO3 (k=12-15). An example of a material with a much higher k value is CoTiO3 (k=40). Dielectric materials with a k value greater than that of SiO2, in particular greater than that of Si3N4, are preferred for use as the field shaping region in accordance with the present invention.

Figure 6:
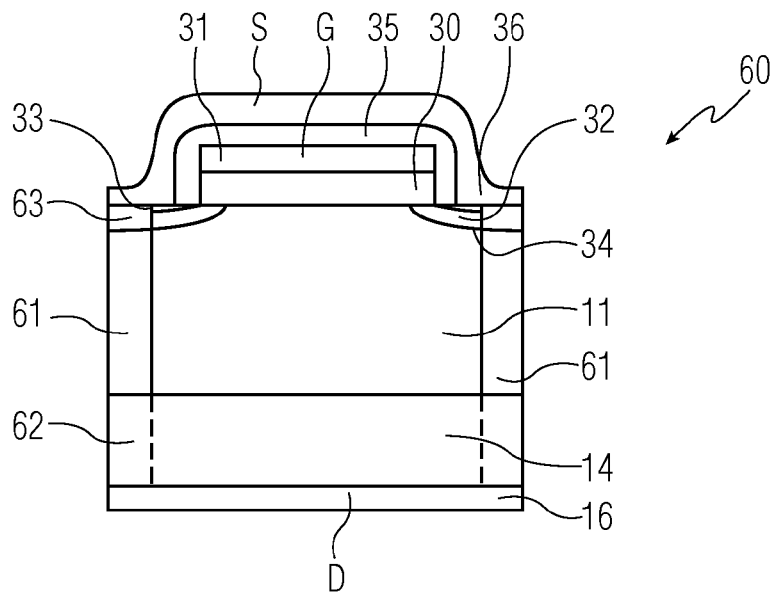
FIGS. 6 and 6A each show a diagrammatic cross-sectional view through part of a planar gate vertical insulated gate field effect transistor semiconductor device in accordance with the present invention.
Figure 6A:
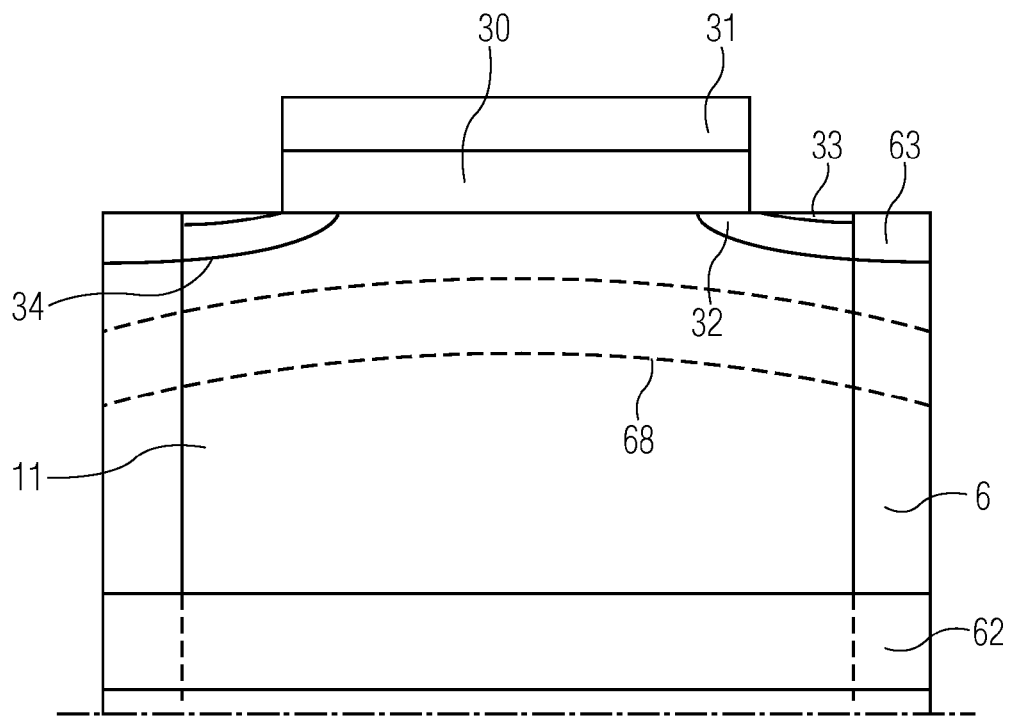

FIG. 6 of the accompanying drawings shows a cross-section views of part of a planar gate vertical insulated gate field effect transistor semiconductor device 60 in accordance with the present invention. The device 60 comprises a silicon semiconductor body including an n+substrate drain region 14 on top of which is an n− drain drift region 11. An insulated gate structure G consists of a gate dielectric layer 30 and a gate conductive layer 31 provided on the top surface of the semiconductor body. The insulated gate structure G, when viewed in plan, defines a regular mesh or grid having openings in each of which is formed a source cell consisting of a p-type body region 32 forming a pn junction 34 with the drain drift region 11 and containing an n+ source region 33. FIG. 6 shows half of each of two source cells, one cell at each side of the shown section of the gate structure G. An insulating region 35 is provided over the gate structure G. Source metallisation 36 contacting all of the source regions 33 is provided on the top semiconductor surface over the insulating region 35 to provide a source electrode S. Electrical connection to the insulated gate structure G is provided by windows through the insulating region 35. A metallisation layer 16 contacts the drain region 14 to provide a drain electrode D. Field shaping insulating regions 61, which may be Ta2O5, are each adjacent to the pn junction 34 between the p body 32 and the n− drain drift region 11 and are each capacitively coupled between a first capacitive voltage coupling region 62 which is integral with the n+ drain region and a second capacitive voltage coupling region 63 preferably consisting of highly doped poly silicon or metal (which may be an extension of the source metallisation 36) which is adjacent the p body region 32 and source region 33 of the device and at the same potential as these two regions. The second capacitive voltage coupling region 63 could alternatively be the p body region 32 or the source region 33 itself. A metal or highly doped poly silicon second capacitive voltage coupling region 63, which is preferable because it results in stronger depletion in the n drain drift region 11, is preferably separated from the semiconductor silicon by a thin insulating layer (not shown). FIG. 6A shows part of the device of FIG. 6 on an enlarged scale to illustrate the effect of providing the Ta2O5 field shaping region. FIG. 6A shows the equilines of voltage at the reverse breakdown voltage (source to drain) of the device in the field shaping region 61 and in the adjacent semiconductor region in the region of the pn junction 34. The field shaping in the region of the pn junction which increases the breakdown voltage of the device is limited to the depletion region. The dashed line 68 shows the edge of the stretched pn junction depletion region which extends only partly through the drain drift region 11. This corresponds to the depletion region stretching shown for a diode in FIG. 3A discussed above. In the examples of document WO01/59847 discussed above the field shaping extends across the whole of the drain drift region and also farther away from the pn junction to where the field shaping semi insulative conducting region contacts the n+ drain region.

The advantage of the arrangement of the present invention is that the field shaping region is insulating and is capacitively coupled and shapes only the depletion region and does not "shape" the electric field in the semiconductor material containing the depletion layer far outside the depletion region. In the arrangements of WO-A-01/59847 and WO-A-03/043089, which use semi-insulating material as the field shaping region, the field stretching is over the whole length of the semi-insulating layer and this induces a stretching of the depletion layer in the semiconductor having the pn junction far outside the original depletion region which enlarges its capacitance more than is necessary for the required increased breakdown voltage of the device. With the capacitively coupled insulating field shaping region according to the present invention the stretching is limited automatically because the depletion layer charge increase is determining the stretching so that there is a "feedback" adapting to the reverse bias. It is the use of an insulating field shaping region which avoids the (parasitic) extra current leakage present in the arrangement of WO-A-01/59847 and limits the field shaping to the depletion region. It is to be noted that WO-A-01/59849 mentions the possible use of silicon nitride for the semi-insulating layer which would require the processing and composition of the silicon nitride to ensure this semi-insulating property. If silicon nitride is used as the field shaping material in the present invention its processing and composition will be such as instead to ensure its insulating property. Because the effect of the insulating field shaping region is limited to the part of the semiconductor silicon where a depletion layer exists, the exact location of the beginning and ending of the field shaping region is less sensitive than for the WO-A-01/59847 arrangement. Thus, although in the device shown in FIG. 6 the field shaping region 11 is adjacent only the p side of the pn junction 34, the field shaping region 11 could instead extend up to the metal source electrode 36, S as the second capacitive voltage coupling region and so bridge the pn junction. In this case the field shaping region 11 would be coupled to capacitive voltage coupling regions which are not quite at the same voltages as those at the two sides of the reversed bias pn junction in the semiconductor region (that is the p body and the n drain drift region). The effect would therefore not be quite so strong but would still be satisfactory. An insulating layer could be provided between a second capacitive voltage coupling metal contact and the semiconductor regions. In other devices within the scope of the present invention, for example the diode as shown in FIG. 2, the insulating field shaping region, since it will not allow current flow, can be connected between two metal capacitor electrodes.

In the examples of a field effect device described in WO-A-03/043089, the field shaping region is described as being intrinsic semiconductor material, or being extrinsic semiconductor material which is lower doped than the drift region or being semi-insulating material; and the first and second capacitor electrode regions adjacent the ends of the field shaping region have different electron energy barriers. By contrast, in a field effect transistor in accordance with the present invention, the field shaping material is an insulating material; the capacitive voltage coupling regions at the ends of the insulating field shaping region may have but do not have to have different electron energy barriers; and, importantly, an electric field in part of the field shaping region induces a stretched electric field (as shown in FIG. 6A) which is limited to the depletion region near the p body—drift region junction and which does not extend along the whole of the drift region, that is to say that the capacitive field shaping is limited to the depletion layer width which is where the voltage drop occurs in the device.

Figure 7:
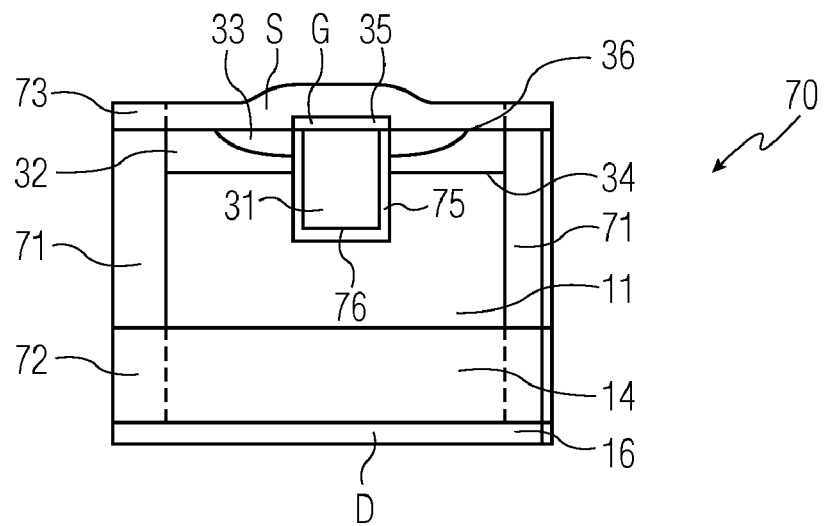
FIGS. 7 and 7A each show a diagrammatic cross-sectional view through part of a vertical trench-gate insulated gate field effect transistor semiconductor device in accordance with the present invention.
Figure 7A:
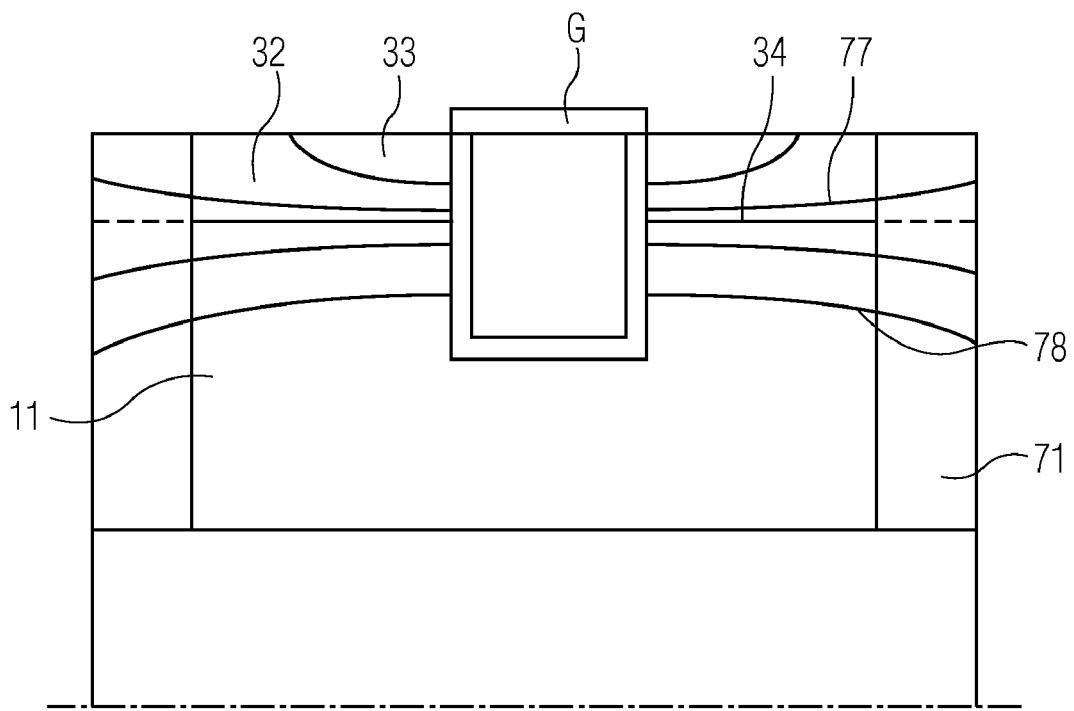

FIG. 7 of the accompanying drawings shows a cross-section view of part of a vertical trench-gate insulated gate field effect transistor semiconductor device 70 in accordance with the present invention. A semiconductor body has an n+ source region 33 in a p-type body region 32 which forms a pn junction 34 with an n– drain drift region 11 above an n+ drain region 14. A trench-gate gate structure G comprises a trench 75 extending from the top surface of the semiconductor body past the source region 33 and the pn junction 34 into the drain drift region 11. The gate structure G comprises an insulating layer 76 provided in the trench 75 between gate conductive material 31 and the semiconductor body adjacent the trench 75. A top insulating layer 35 is provided over the gate conductive material 31. In the same manner as described above with reference to FIG. 6, half of each of two source cells are shown in FIG. 7, one at each side of the shown section of the trench-gate structure G. Field shaping insulating dielectric regions 71, which may be e.g. Ta2O5, are each adjacent to and also bridge the pn junction 34 between the p body 32 and the n– drain drift region 11 and are each capacitively coupled between a first capacitive voltage coupling region 72 which is integral with the n+ drain region 14 and a second capacitive voltage coupling region 73 which is integral with the metal source electrode 36. It is to be noted that in the examples of field effect devices described in WO-A-03/043089, the field shaping region does not bridge the junction between the p body and the n-drain drift region. FIG. 7A shows the voltage equilines as dashed lines at the source to drain breakdown voltage of the device, as a non-uniform electric field in part of the field shaping regions 71 and in the induced stretched depletion region 77, 78 in the adjacent semiconductor region across the pn junction 34. Similarly as for FIG. 6, the edge 78 of the stretched depletion region extends only partly through the drain drift region 11.

In general terms, all the field effect transistor devices which have been described in WO-A-03/043089 may be modified to be within the scope of the present invention essentially by substituting insulating dielectric material for the field shaping region. The devices just described with reference to FIGS. 6 and 7 of the accompanying drawings are examples of such a modification which is mainly by such substitution.

Figure 8A:
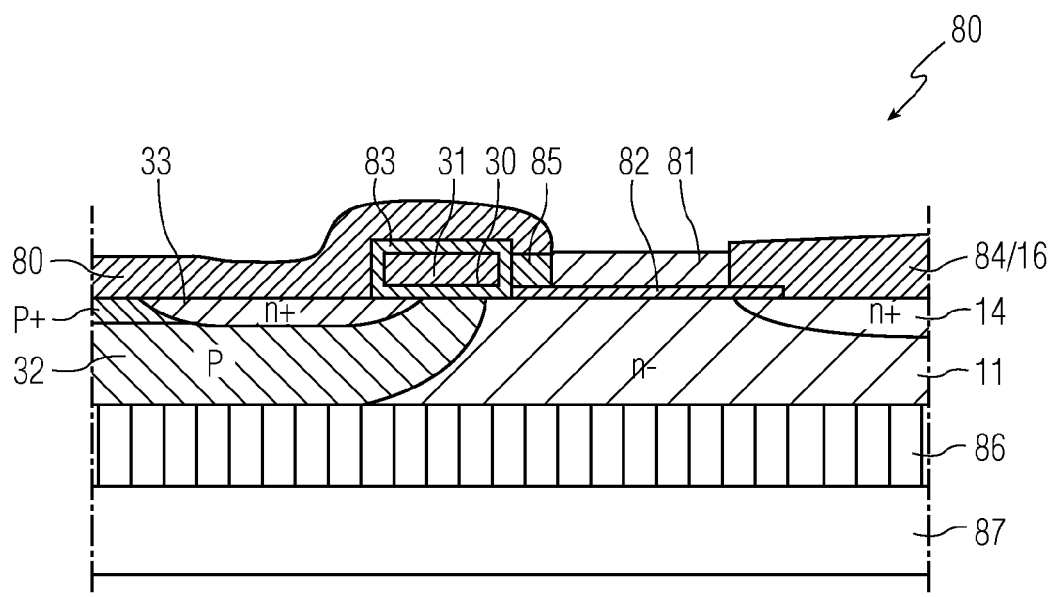
FIGS. 8A and 8B show cross-section and plan views respectively of a lateral insulated gate field effect transistor device in accordance with the present invention.
Figure 8B:
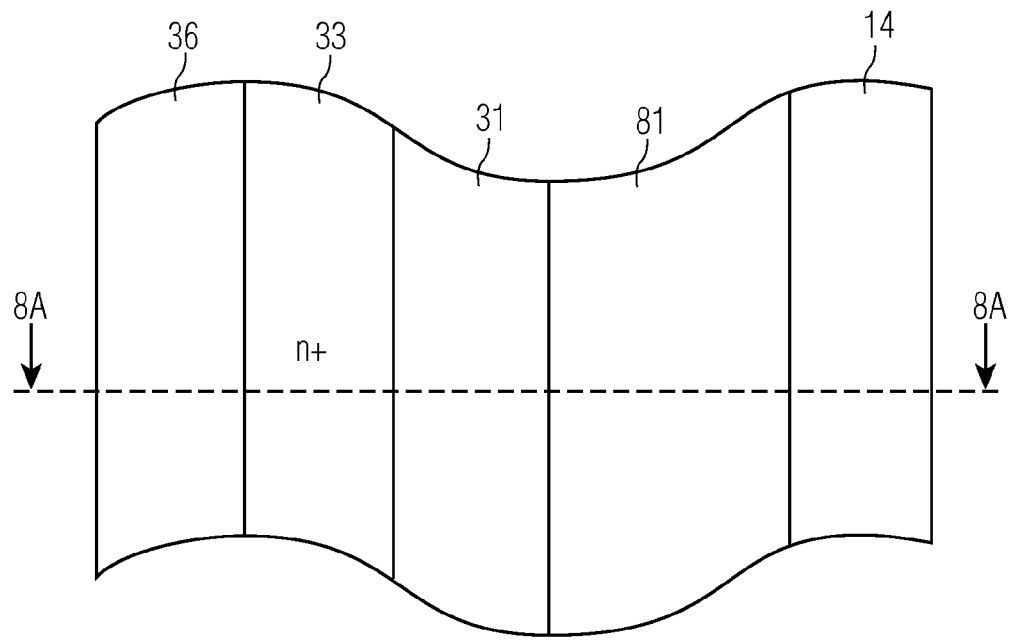

An example of a lateral insulated gate field effect transistor device disclosed in WO-A-03/043089 which is modified to be in accordance with the present invention is shown in the cross-section and plan views respectively of FIGS. 8A and 8B of the accompanying drawings. The n+ source region 33, the n+ drain region 14 and the n– drain drift region 11 are underneath a top major surface of the device. A planar insulated gate having a gate dielectric layer 30 and a gate conductive layer 31 is above the top major surface. A p body channel-accommodating region 32 is also underneath the top surface. A field shaping insulating dielectric region 81, which may be Ta2O5, is above the top major surface adjacent, that is near to, the pn junction between the p body region 32 and the n drain drift region 11 and separated from the drain drift region by a thin insulating SiO2 region 82. A first capacitive voltage coupling region 84 for the field shaping region 81 is formed by the drain electrode 16. A source metallisation electrode 36 contacts the source region 33 and extends over an insulation layer 83 covering the gate conductive layer 31 to contact a p+ region which is adjacent one end of the dielectric field shaping region 81 and which provides a second capacitive voltage coupling region 85 for the field shaping region 81. The p+ region could be omitted with the source electrode 36 being in direct contact with the field shaping region 81. The device 80 may be made as illustrated using a silicon layer on insulating substrate (SOI) process involving a buried oxide layer 86 on a substrate 87.

Figure 9:
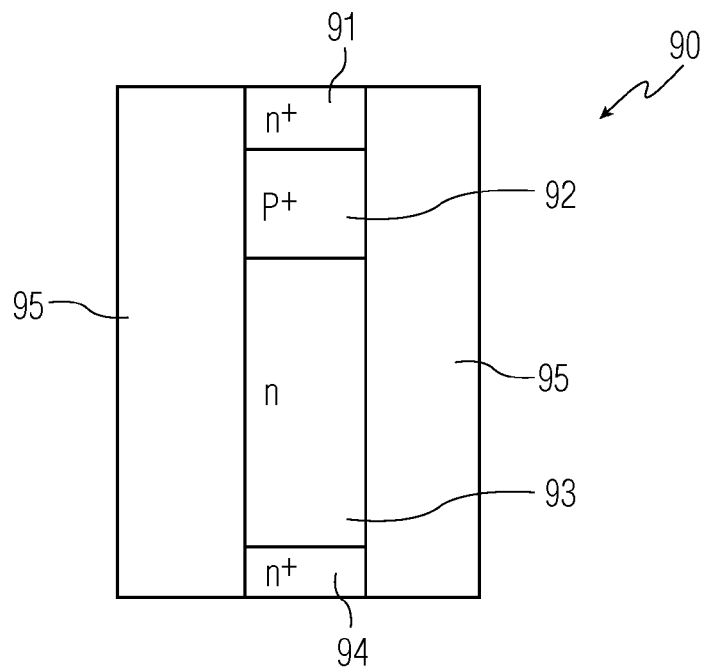
FIGS. 9 and 10 show a schematic representation and a cross-section view respectively of a bipolar transistor in accordance with the present invention.

FIG. 9 of the accompanying drawings shows a schematic representation of a bipolar transistor 90 according to the present invention. The n+ emitter region 91, p+ base region 92, n collector drift region 93 and n+ collector region 94 are embedded in a two sided arrangement of field shaping dielectric/insulating regions 95 which, under reverse voltage, stretch the electric field/depletion region at the base-collector junction and increase the reverse breakdown voltage.

In general terms, all the bipolar transistor structures disclosed in WO-A-03/015178 may be modified to be within the scope of the present invention essentially by substituting insulating/dielectric material for the semi-insulating field shaping region referred to as the gate region in WO-A-031015178. An example of this is shown in the cross-section view in FIG. 10 of the accompanying drawings, which is a modification of the structure shown in FIG. 3 of WO-A-03/015178.

Figure 10:
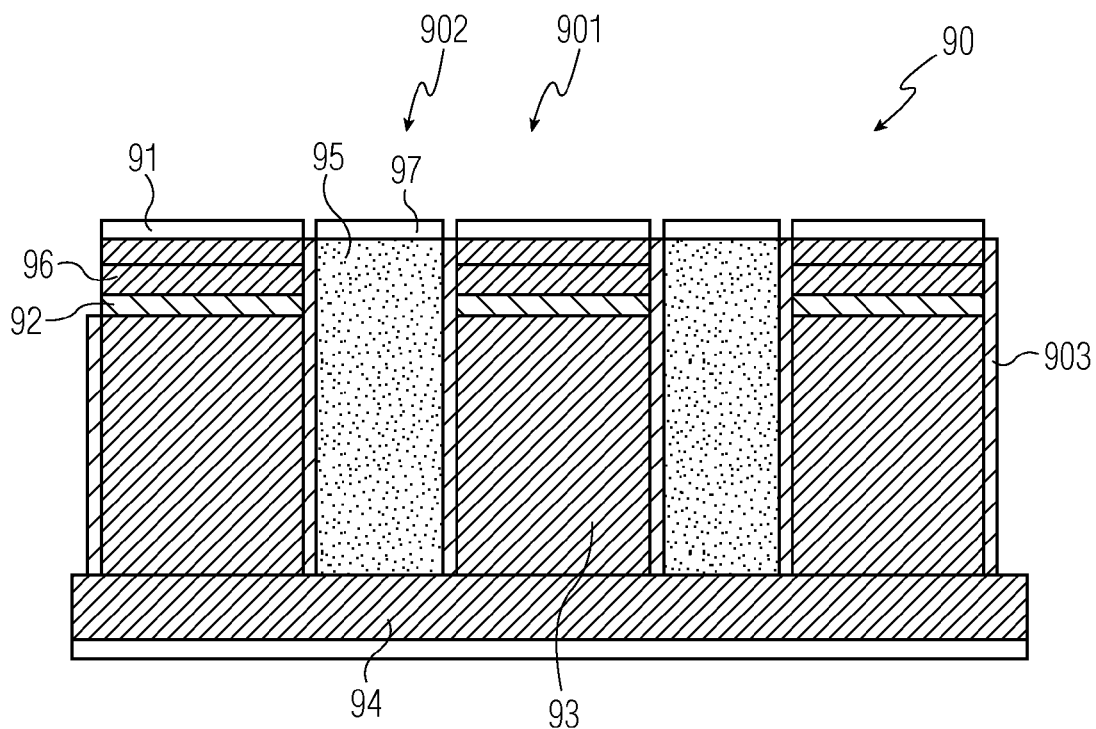

In the bipolar transistor 90 of FIG. 10, a vertical structure has an n+ collector substrate 94 with a plurality of mesas 901 each consisting of an n collector drift region 93, a thin p type base layer 92, an emitter-base space charge region 96 and an emitter region 91. Each mesa 901 is surrounded by a trench 902, optionally separated from the mesa by a thin passivating SiO2 insulating layer 903, and containing, preferably high k, insulating/dielectric material as the field shaping region 95 bridging the pn base 92 collector 93 junction in the mesa 901. A first capacitive voltage coupling region for each field shaping region 95 is formed integral with the n+ collector region 94 and a second capacitive voltage coupling region 97 for each field shaping region 95 is formed by a metal contact on top of the dielectric 95. The second capacitive voltage coupling region contact could alternatively be connected to the base or the emitter.

Figure 11:
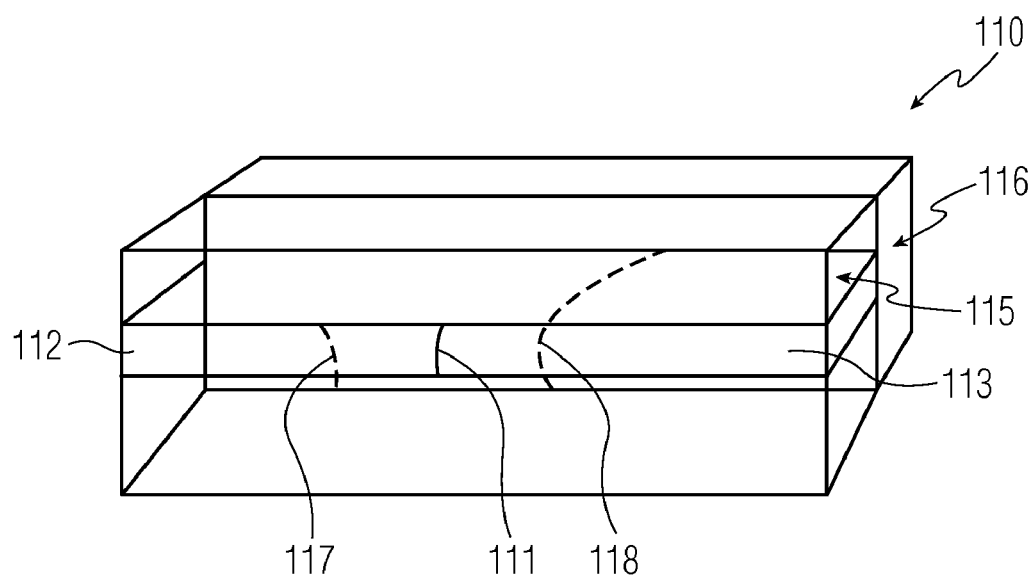
FIG. 11 shows a schematic perspective view of a silicon on insulator structure in accordance with the present invention.

FIG. 11 of the accompanying drawings shows another example of a silicon on insulator (SOI) structure 110 in accordance with the present invention. The semiconductor p and n regions 112, 113 which are shown on an oxide substrate 114 and forming a pn junction 111 could just be a simple diode device, but could also be considered as incorporating a drift region such as the body and drain drift region of a field effect transistor or the base and collector drift region of a bipolar transistor. A two part insulating dielectric, preferably high k, field shaping region 115, 116 is on top of and at the rear side of the p and n semiconductor regions. In the structure shown in FIG. 11 voltages can be connected to the semiconductor regions 112, 113 and to the field shaping regions 115, 116 by contacts (not shown) to the left hand side and right hand side of the structure. Alternatively, contacts for voltage application can be made only to the p and n regions 112, 113 which then provide required first and second capacitive-voltage coupling regions for the field shaping regions 115, 116. The presence of a high k field shaping region at the rear side as well as the top side of the p and n semiconductor regions illustrates that the capacitive field shaping in accordance with the present invention can involve a three dimensional (non-linear) distribution of charge. The edges of the stretched pn junction depletion region at reverse breakdown voltage are shown by the dashed lines 117, 118 and 119.

Figure 12:
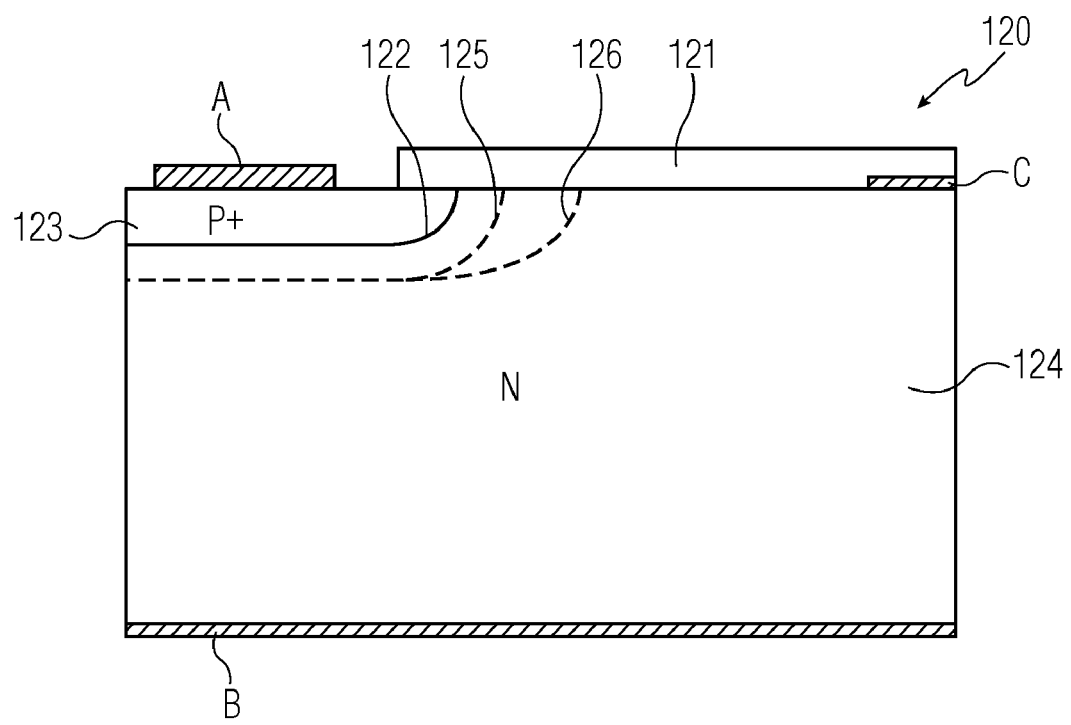
FIG. 12 shows a schematic cross-section view of a pn junction edge termination structure in accordance with the present invention.

FIG. 12 of the accompanying drawings shows a structure in which an insulating/dielectric (preferably high k) field shaping region 121 is used in accordance with the present invention for increasing breakdown voltage at the edge termination of a pn junction, that is the point at which the shown pn junction 122 between a p region 123 and an n region 124 ends with a smoothed curve at a lateral surface. In accordance with the present invention the field shaping region 121 on top of the lateral surface induces a higher radius of curvature of the depletion region of the pn junction 122 formed at the lateral surface (the depletion region shown with a dotted line 125 is stretched to the dash-dot line 126) and hence the breakdown voltage of the pn junction is increased. The relevant reverse voltage applied to the pn junction is applied to contacts A and B or to contacts A and C. Because the high k field shaping region 121 touches the p and n regions 123, 124 (directly as shown or via a thin insulator) it is automatically connected and capacitively coupled to the same voltages as are applied to the pn junction 122. In the case of contacts A and B, the p and n regions 123, 124 alone function as first and second capacitive voltage coupling regions for the field shaping region 121. Such edge terminations, which can benefit from the present invention as shown in FIG. 12, occur with nearly all pn junctions in a planar semiconductor device. Thus such a junction in a planar device can be a simple diode as shown in FIG. 12 or e.g. a base-collector junction.

From reading the present disclosure, other variations and modifications will be apparent to persons skilled in the art. Such variations and modifications may involve equivalent and other features which are already known in the art, and which may be used instead of or in addition to features already described herein.

Although claims have been formulated in this application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new claims may be formulated to such features and/or combinations of such features during the prosecution of the present Application or of any further Application derived therefrom.

What is claimed is:

1. A semiconductor device including a semiconductor region having p and n semiconductor regions which form a pn junction and a field shaping region located adjacent only one of the p and n semiconductor regions to increase the reverse breakdown voltage of the device, wherein the field shaping region is insulating material and the field shaping region extends from a first capacitive voltage coupling region to a second capacitive voltage coupling region which are provided to apply, in use, substantially the same voltages as are applied to the pn junction, the material and capacitive coupling of the field shaping region being such that, when a reverse voltage is applied across the pn junction and the device is non-conducting, a capacitive electric field is present in a part of the field shaping region which extends beyond a limit of the pn junction depletion region which would exist in the absence of the field shaping region, the electric field in the field shaping region inducing a stretched electric field limited to a correspondingly stretched pn junction depletion region in the semiconductor region.

2. A device as claimed in claim 1, wherein the field shaping region insulating material has a dielectric constant greater than that of silicon dioxide.

3. A device as claimed in claim 2, wherein the field shaping region insulating material has a dielectric constant greater than that of silicon nitride.

4. A device as claimed in claim 3, wherein the field shaping insulating material is tantalum oxide $Ta_2O_5$.

5. A device as claimed in claim 1, wherein the insulating field shaping region is adjacent the n semiconductor region.

6. A device as claimed in claim 1, wherein said insulating field shaping region is adjacent only one side of the n semiconductor region.

7. A device as claimed in claim 1, wherein said insulating field shaping region is adjacent both sides of the n semiconductor region.

8. A device as claimed in claim 1, wherein at least one of the first and second capacitive voltage coupling regions comprises a conductive material region.

9. A device as claimed in claim 8, wherein the conductive material region is integral with a main electrode of the device.

10. A device as claimed in claim 1, wherein the capacitively coupled insulating field shaping region is separated by an insulating region from the semiconductor region having the pn junction.

11. A device as claimed in claim 1, wherein the device is a diode device and the pn junction is the rectifying junction of the diode device.

12. A device as claimed in claim 1, wherein the device is a bipolar transistor and the pn junction is the junction between the base region and a collector drift region of the device.

13. A device as claimed in claim 1, wherein the device is a field effect transistor and the pn junction is the junction between the channel accommodating body region and a drain drift region of the device.

14. A device as claimed in claim 12, wherein the drift region is non-uniformly doped.

15. A device as claimed in claim 12, wherein the stretched pn junction depletion region extends only partly through said drift region.

16. A semiconductor device, comprising:
a p-based semiconductor region and an adjacent n-based semiconductor region, with a pn junction formed therebetween;
a field shaping region located adjacent one of the semiconductor regions, and not the other of the semiconductor regions, configured and arranged to
include an insulation material,
extend from a first capacitive voltage coupling region to a second capacitive voltage coupling region which are provided to apply, in use, substantially the same voltages as are applied to the pn junction, the insulation material and capacitive coupling of the field shaping region being such that, when a reverse voltage is applied across the pn junction and the device is non-conducting, a capacitive electric field is present in a part of the field shaping region that extends beyond a limit of the pn junction depletion region which would exist in the absence of the field shaping region, the electric field in the field shaping region inducing a stretched electric field limited to a correspondingly stretched pn junction depletion region in the semiconductor region.

* * * * *